(12) United States Patent  (10) Patent No.: US 6,699,725 B2
Lee  (45) Date of Patent: Mar. 2, 2004

(54) METHODS OF FABRICATING FERROELECTRIC MEMORY DEVICES HAVING A FERROELECTRIC PLANARIZATION LAYER

(75) Inventor: Kyu-Mann Lee, Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/164,186

(22) Filed: Jun. 5, 2002

(65) Prior Publication Data

US 2002/0197744 A1 Dec. 26, 2002

(30) Foreign Application Priority Data

Jun. 21, 2001 (KR) ........................................ 2001-35430

(51) Int. Cl.[7] ............................................... H01L 21/00
(52) U.S. Cl. ............................. 438/3; 438/240; 438/396
(58) Field of Search ........................... 438/3, 240, 253, 438/254, 255, 396, 397, 398

(56) References Cited

U.S. PATENT DOCUMENTS 5,786,259 A  *  7/1998  Kang ........................... 438/396
2002/0125524 A1  *  9/2002  Okudaira et al. ............ 257/310

* cited by examiner

Primary Examiner—Tuan H. Nguyen
(74) Attorney, Agent, or Firm—Myers Bigel Sibley & Sajovec

(57) ABSTRACT

In the present invention, ferroelectric memory devices using a ferroelectric planarization layer and methods of fabricating the same are disclosed. According to the method of the present invention, a conductive layer is formed on an interlayer insulation layer having a contact plug and patterned to form capacitor bottom electrode patterns. A ferroelectric layer for planarization is formed to fill a space between the bottom electrode patterns, and then another ferroelectric layer for a capacitor is formed on the bottom electrode pattern and the ferroelectric layer for planarization.

16 Claims, 5 Drawing Sheets

METHODS OF FABRICATING FERROELECTRIC MEMORY DEVICES HAVING A FERROELECTRIC PLANARIZATION LAYER

RELATED APPLICATION

This application relies for priority upon Korean Patent Application No. 2001-35430, filed on Jun. 21, 2001, the contents of which are herein incorporated by reference in their entirety.

FIELD OF THE INVENTION

The present invention relates to memory devices, and more particularly to ferroelectric memory devices and to methods of fabricating ferroelectric memory devices.

BACKGROUND OF THE INVENTION

Ferroelectric materials can obtain a magnetic polarization when exposed to an external electric field. The direction of the polarization can be controlled by changing the external electric field. When the external electric field is removed much of the polarization can remain in the ferroelectric materials. Examples of ferroelectric materials include PZT [$Pb(Zi,Ti)O_3$], SBT[$SrBi_2Ta_2O_9$] and other materials having a ferroelectric crystalline structure known as a perovskite structure. Memory devices which employ ferroelectric materials, such as ferroelectric random-access memories (FRAM), are widely used.

SUMMARY OF THE INVENTION

According to some embodiments of the present invention a ferroelectric memory device can include at least two bottom electrode patterns formed on a semiconductor substrate, a first ferroelectric layer disposed between the bottom electrode patterns, and a second ferroelectric layer formed over the bottom electrode patterns and the first ferroelectric layer. Top surfaces of the first ferroelectric layer and the bottom electrode patterns can be substantially aligned to provide a planarized surface on which the second ferroelectric layer can be formed. The first ferroelectric layer can also serve as a seed layer for creating a perovskite structure in the first and second ferroelectric layers for use as a capacitor in the ferroelectric memory device.

The ferroelectric memory device can further include an interlayer insulation layer on the semiconductor substrate with storage node contact plugs which pierce the interlayer insulation layer. The bottom electrode patterns can be formed on top of the interlayer insulation layer and electrically connected to the storage node contact plugs.

According to further embodiments of the present invention a method of fabricating a ferroelectric memory device can be provided. At least two bottom electrode patterns are formed on a semiconductor substrate. A first ferroelectric material layer is formed between the bottom electrode patterns. A second ferroelectric material layer is formed on a top surface of the first ferroelectric material layer and the bottom electrode patterns. The top surface of the first ferroelectric material layer can be substantially aligned with the top surface of the bottom electrode patterns.

In further embodiments of the fabrication method, a semiconductor device bottom structure such as a transistor is formed in the semiconductor substrate. An interlayer insulation layer is formed over the semiconductor substrate and patterned to expose a contact hole to the semiconductor substrate. A conductive layer is formed in the contact hole and etched to provide a contact plug in the contact hole. Another conductive layer is formed over the contact plug and patterned to form a capacitor bottom electrode pattern. The conductive layers can be formed of a noble metal of platinum and the like or an oxide or combination thereof. A ferroelectric material layer is formed on the semiconductor substrate to fill a space between the patterned bottom electrode patterns. The ferroelectric material layer is planarized to expose the top surface of the bottom electrode patterns and to leave a remnant ferroelectric material layer between the bottom electrode patterns. In this manner, top surfaces of the remnant ferroelectric material layer and the bottom electrode patterns are substantially aligned and providing a planarized surface therebetween. Another ferroelectric layer for a capacitor is formed on the remnant ferroelectric material layer and the top surface-exposed bottom electrode patterns.

DETAILED DESCRIPTION OF THE INVENTION

Figure 1:
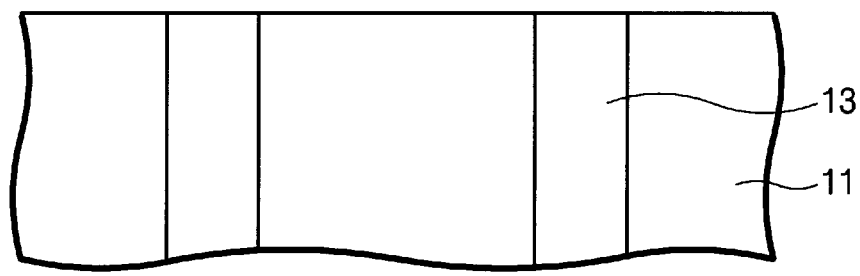
FIGS. 1 through 6 are cross-sectional views illustrating steps of fabricating ferroelectric capacitors of a ferroelectric random access memory (FRAM) according to first embodiments of the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present.

Referring first to FIGS. 1 through 6, steps of fabricating a ferroelectric capacitor of a ferroelectric random access memory (FRAM) according to first embodiments of the present invention are illustrated.

Referring to FIG. 1, an interlayer insulation layer 11 is stacked on a substrate structure (not shown), and a contact plug 13 is formed in the interlayer insulation layer 11. The substrate may include a MOS transistor having source/drain regions, a gate electrode between the source and drain regions, and a bit line coupled with a drain of the MOS transistor. Each contact plug may be directly connected with a source region of a transistor of each memory cell or indirectly connected through a contact pad or other intervening structures.

Figure 2:
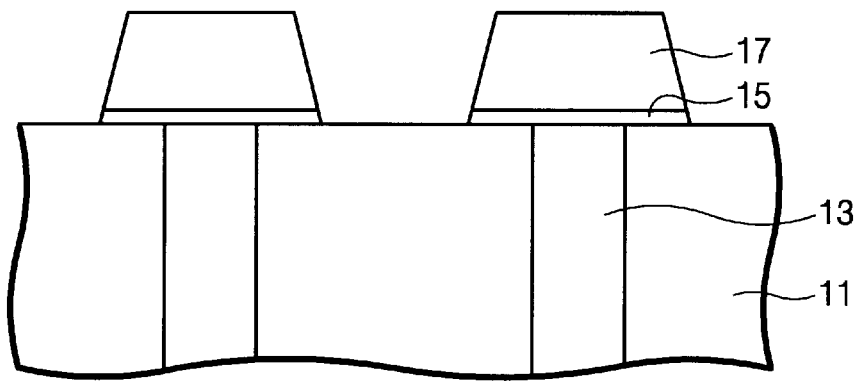

Referring to FIG. 2, a layer of adhesion assistant material such as titanium can be formed over the interlayer insulation layer 11 and the contact plugs 13. A layer of an electrode material such as platinum can be formed over the adhesion assistance material. The layer of the electrode material and the layer of the adhesion assistant material can be sequentially patterned to form adhesion assistant layers 15 and first electrodes 17. Each first electrode 17 can be formed slantingly by an etching process so that its cross-section becomes a trapezoid with a surface adjacent the adhesion assistant layer which is larger than a surface opposite the adhesion assistant layer.

The adhesion assistant layer 15 may reduce stress which can be generated between the first electrodes 17 and the interlayer insulation layer 11 during a thermal process. The adhesion assistant layers 15 may also increase adhesion between the first electrodes 17 and the interlayer insulation layer 11. The adhesion assistant layers 15 may include a titanium nitride, a titanium silicide, a titanium silinitride (TiSiN) and/or titanium. The adhesion assistant layers 15 can also include a metal having a high melting point, such as tantalum, iridium, ruthenium and/or tungsten, and/or a silicide and/or a nitride of one or more of these metals. The adhesion assistant layers can be formed using sputtering, CVD, sol-gel, and/or other techniques known to those skilled in the art.

The first electrodes 17 can include a metal such as ruthenium, iridium, rhodium, osmium, palladium, and/or platinum, and/or a conductive oxide or combination of one or more of these metals.

Figure 3:
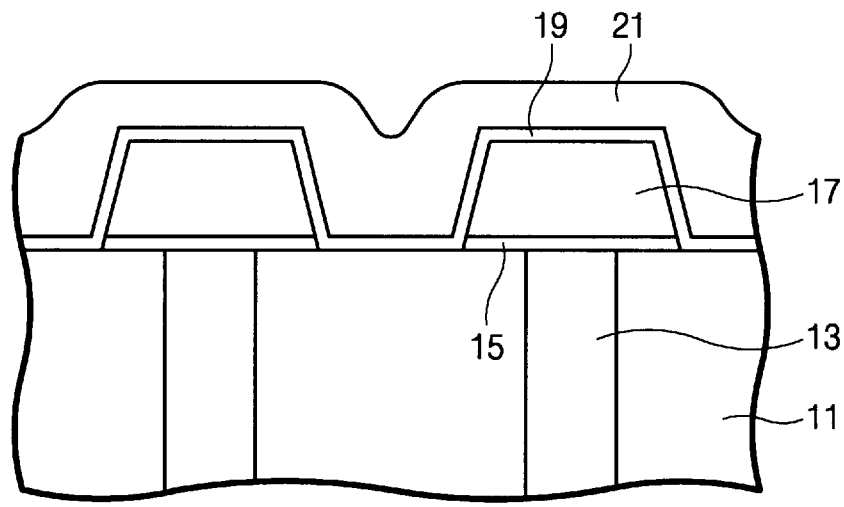

Referring to FIG. 3, an oxidation barrier 19 can be formed over the substrate and first electrodes 17, thereby covering the first electrodes 17 and the neighboring interlayer insulation layer 11. A planarization assistant layer 21 can be formed using a material and steps which provide improved step-coverage characteristics. For example, the planarization assistant layer 21 can be a silicon oxide layer formed using plasma enhanced chemical vapor deposition (PECVD), low pressure chemical vapor deposition (LPCVD), and Atomic Layer Deposition(ALD). The oxidation barrier layer 19 can be formed of one or more metal oxides such as aluminum oxide ($Al_2O_3$), titanium oxide ($TiO_2$), zirconium oxide ($ZrO_2$), and cesium oxide($CeO_2$).

Figure 4:
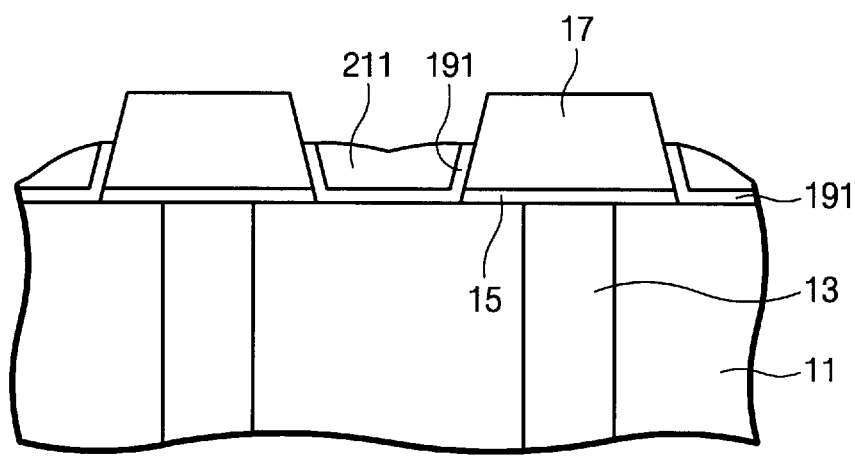

Referring to FIGS. 3 and 4, entire anisotropic etching can be performed to remove portions of the planarization assistant layer 21 and the oxidation barrier layer 19, thereby exposing top surfaces and sidewalls of the first electrodes 17. It may be desirable to use an etchant having a high selectivity on the first electrodes 17 with respect to the planarization assistant layer 21 and the oxidation barrier layer 19. As a result, an oxidation barrier layer pattern 191 and a planarization assistant pattern 211 can be formed to fill a space between the exposed top sidewall of the first electrodes 17.

Figure 5:
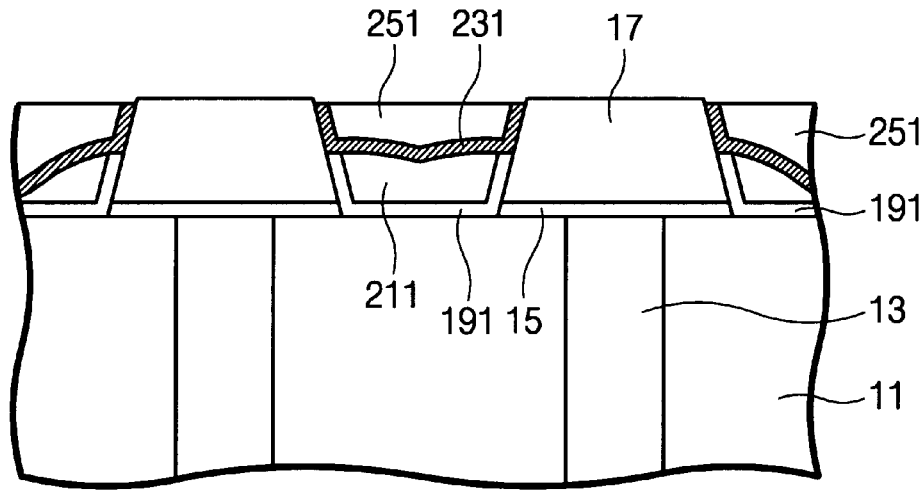

Referring to FIGS. 4 and 5, a reaction barrier layer can be conformally stacked on the substrate of FIG. 4. A ferroelectric material layer in an amorphous state can be stacked on the reaction barrier layer using a sol-gel method. The ferroelectric layer and the reaction barrier layer can be anisotropically etched using an etchant having a low etch selectivity ratio with respect to those layers, thereby leaving a remnant ferroelectric layer 251 and a remnant reaction barrier layer 231 and again exposing top surfaces of the first electrodes 17. Except for the space filled with a remnant planarization assistant pattern 211 in the space between the first electrodes 17, a residual space is filled with the remnant ferroelectric layer 251 so that a top surface of the remnant ferroelectric layer 251 is substantially aligned with a top surface of the first electrodes 17.

The ferroelectric layer 251 can be $Pb(Zr,Ti)O_3$ [PZT], $PbTiO_3$, $PbZrO_3$, La-doped PZT, PbO, $SrTiO_3$, $BaTiO_3$, $(Ba,Sr)TiO_3$ [BST], and/or $SrBi_2Ta_2O_9$ [SBT]. The reaction barrier layer 231 can be a titanium oxide layer which can reduce reaction between the ferroelectric layer 251 and the silicon oxide used as the planarization assistant pattern 211.

When used as the reaction barrier layer 231, a titanium oxide layer can also function as a seed layer, so that the ferroelectric layer 251 stacked thereon forms a ferroelectric perovskite structure during a later described rapid thermal processing of the remnant ferroelectric layer 251. The reaction barrier layer 231 can alternatively be formed from a noble metal such as platinum, ruthenium, and/or iridium, oxides of those metals, and/or $SrRuO_3$. The ferroelectric layer 251 can be formed using a method such as PECVD, LPCVD, and/or ALD instead of a sol-gel method. The reaction barrier layer 231 can be formed using a method such as CVD or ALD.

If the remnant ferroelectric layer 251 was formed in direct contact with the planarization assistant pattern 211 without the use of the reaction barrier layer 231, a pyrochlore phase could form at the interface therebetween which can hinder formation of a perovskite crystalline structure during a rapid thermal processing of the remnant ferroelectric layer 251. The pyrochlore phase can also have a high volumetric expansion rate which can induce a lifting of the remnant ferroelectric layer 251 relative to the first electrodes 17 and result in uneven surfaces therebetween.

Figure 6:
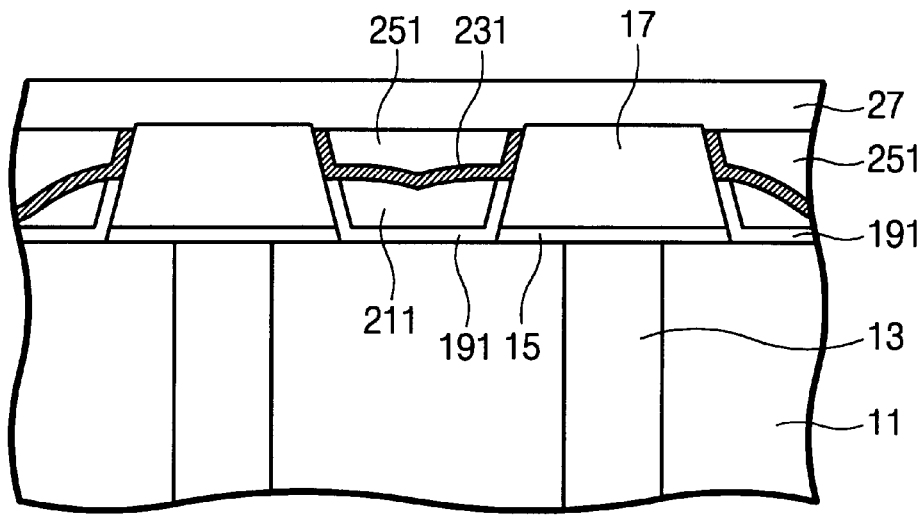

Referring to FIGS. 5 and 6, a second ferroelectric layer 27 of PZT can be formed on the first electrodes 17 and the ferroelectric material layer 251. The second ferroelectric material layer 27 can be $Pb(Zr,Ti)O_3$ [PZT], $PbTiO_3$, $PbZrO_3$, La-doped PZT, PbO, $SrTiO_3$, $BaTiO_3$, $(Ba,Sr)TiO_3$ [BST], and/or $SrBi_2Ta_2O_9$ [SBT]. The second ferroelectric material layer 27 can be formed using a sol-gel method or other CVD methods. The second ferroelectric material layer 27 can serve as a capacitor dielectric layer.

A rapid thermal processing can be performed on the ferroelectric materials using a crystallization thermal treatment with oxygen at a high temperature to provide perovskite structure characteristics in the ferroelectric materials. The temperature for the rapid thermal processing can be above 550° C. and preferably above 700° C. A second electrode is then formed on the second ferroelectric layer 27. In this manner, a capacitor structure for a ferroelectric memory device, as shown in FIG. 6, can be formed according to embodiments of the present invention.

Figure 7:
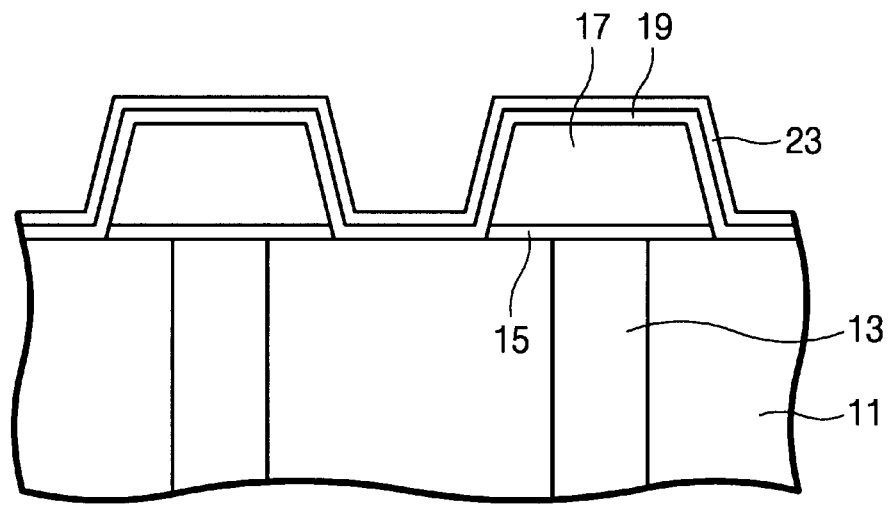
FIGS. 7 through 10 are cross-sectional views illustrating steps of fabricating ferroelectric capacitors according to additional embodiments of the present invention.

Additional embodiments of a ferroelectric memory devices and fabrication methods according to the present invention will now be discussed with reference to FIGS. 7–10. Referring to FIG. 7, beginning with the device formed as shown in FIG. 2, an oxidation barrier layer 19 can be formed over the substrate and first electrodes 17, thereby covering the first electrodes 17 and a neighboring interlayer insulation layer 11. A seed layer 23 is stacked on the oxidation barrier layer 19. The seed layer 23 provides a seed function so that when a ferroelectric layer is stacked thereon it forms a ferroelectric perovskite structure through oxidation-thermal treatment. The seed layer 23 can include titanium oxide and/or $SrRuO_3$. When the oxidation barrier layer 19 is selected to be a titanium oxide layer($TiO_2$), the titanium oxide layer can also function as seed layer 23 in a single layer.

Figure 8:
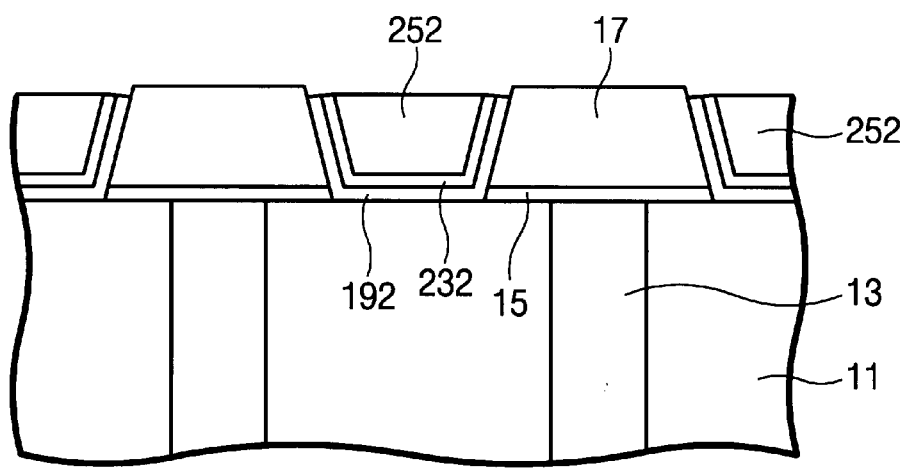

Referring to FIGS. 7 and 8, a ferroelectric material layer for planarization can be stacked on the seed layer 23 by employing a sol-gel method, so as to increase the flatness of the substrate. The first ferroelectric material layer for planarization, the seed layer 23 and the oxidation barrier layer 19 can then be anisotropically etched to expose top surfaces of the first electrodes 17, and so that the space between the first electrodes 17 is filled with a remnant first ferroelectric material layer 252, a remnant oxidation barrier layer 192 and a remnant seed layer 232, thereby providing a more planarized surface.

Figure 9:
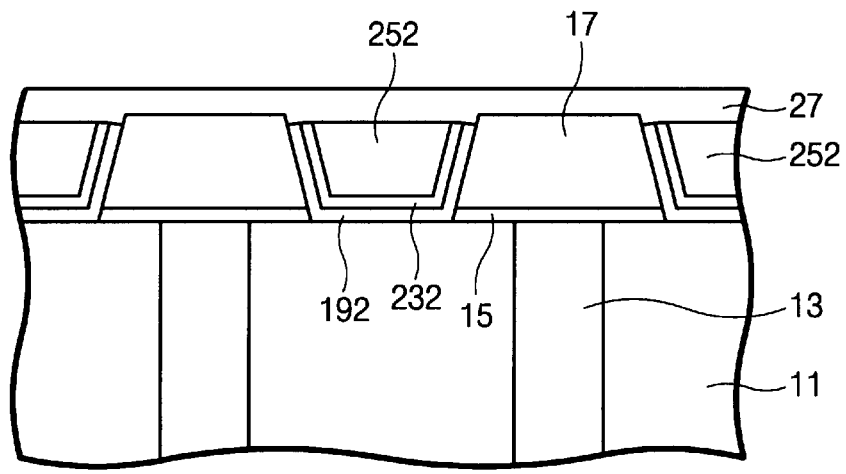

Referring to FIG. 9, a second ferroelectric layer 27 of PZT to serve as a capacitor dielectric can be formed across the first electrodes 17 and the remnant layers 252, 232, and 192.

Figure 10:
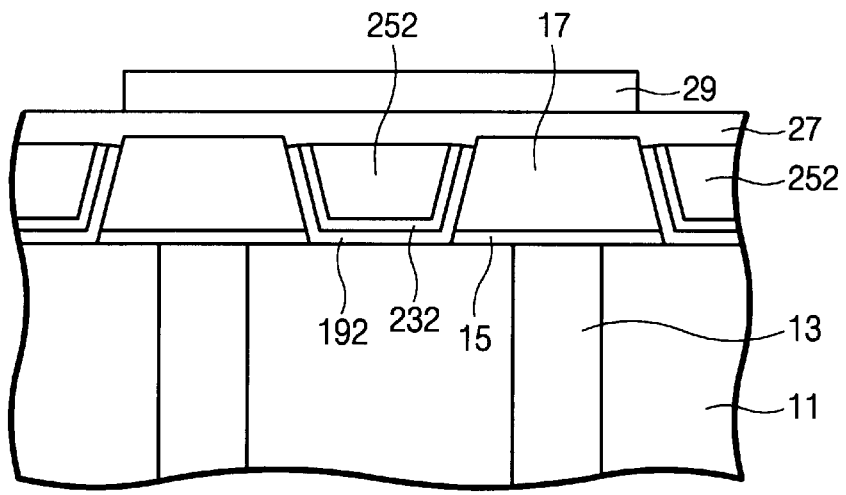

Referring to FIG. 10, a common second electrode 29 can be formed aligned with the two first electrodes 17 on the second ferroelectric layer 27 for the capacitor. In this manner a capacitor structure for a ferroelectric memory device has been formed according to additional embodiments of the present invention.

According to the present invention, since it is possible to provide a relatively flat ferroelectric layer and a second electrode, there is an advantage that a capacitor line can be more easily connected in a subsequent step. Thus, there may be improvement of the capacitor characteristic at the two neighboring memory cells.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of fabricating a ferroelectric memory device, comprising steps of:

forming at least two bottom electrode patterns on a semiconductor substrate;

forming a first ferroelectric material layer between the bottom electrode patterns;

forming a second ferroelectric material layer on a top surface of the bottom electrode patterns and a top surface of the first ferroelectric material layer, and wherein the step of forming a first ferroelectric material layer comprises:

forming the top surface of the first ferroelectric material layer substantially aligned with top surfaces of the bottom electrode patterns.

2. A method of fabricating a ferroelectric memory device, comprising steps of:

forming at least two bottom electrode patterns on a semiconductor substrate;

forming a first ferroelectric material layer between the bottom electrode patterns;

forming a second ferroelectric material layer on a top surface of the bottom electrode patterns and a top surface of the first ferroelectric material layer, wherein the step of forming the first ferroelectric material layer comprises:

depositing a ferroelectric material across the substrate and the bottom electrode patterns; and etching the deposited ferroelectric material to expose the top surface of the bottom electrode patterns and to substantially align the top surface of the bottom electrode patterns with the top surface of the etched ferroelectric material.

3. A method of fabricating a ferroelectric memory device, comprising steps of:

forming at least two bottom electrode patterns on a semiconductor substrate;

forming a first ferroelectric material layer between the bottom electrode patterns;

forming a second ferroelectric material layer on a top surface of the bottom electrode patterns and a top surface of the first ferroelectric material layer, wherein after the step of forming the at least two bottom electrode patterns and before the step of forming the first ferroelectric material layer, further comprising steps of depositing a planarization assistant layer on the substrate and the bottom electrode patterns, and etching the planarization assistant layer to expose the top surface of the bottom electrode patterns and providing a remnant planarization assistant layer between the bottom electrode patterns.

4. A method of fabricating a ferroelectric memory device, comprising steps of:

forming at least two bottom electrode patterns on a semiconductor substrate;

forming a first ferroelectric material layer between the bottom electrode patterns;

forming a second ferroelectric material layer on a top surface of the bottom electrode patterns and a top surface of the first ferroelectric material layer, wherein before the step of forming the first ferroelectric material layer, further comprising the step of forming a seed layer between the bottom electrode patterns.

5. The method of claim 4, wherein the step of forming a seed layer comprises the steps of:

depositing the seed layer on the substrate and the electrode patterns; and etching the seed layer to expose top surfaces of the electrode patterns.

6. A method of fabricating a ferroelectric memory device, comprising steps of:

forming at least two bottom electrode patterns on a semiconductor substrate;

forming a first ferroelectric material layer between the bottom electrode patterns;

forming a second ferroelectric material layer on a top surface of the bottom electrode patterns and a top surface of the first ferroelectric material layer, wherein after the step of forming the bottom electrode patterns, further comprising a step of forming an oxidation barrier layer on the substrate between the bottom electrode patterns.

7. A method of fabricating a ferroelectric memory device, comprising steps of:

forming an interlayer insulation layer pierced by at least two contact plugs on a semiconductor substrate;

forming at least two bottom electrode patterns on the interlayer insulation layer wherein each of the bottom electrode patterns are electrically connected with a respective one of the contact plugs;

forming a seed layer over the bottom electrode patterns and the interlayer insulation layer;

depositing a first ferroelectric material over the seed layer;

etching the first ferroelectric material to expose the top surface of the bottom electrode patterns and to substantially align a top surface of the bottom electrode patterns with a top surface of the etched first ferroelectric material; and depositing a second ferroelectric material over the top surfaces of the bottom electrode patterns and the first ferroelectric material.

8. The method of claim 7, after the step of forming the bottom electrode patterns and before the step of forming the seed layer, further comprising steps of:

forming a planarization assistant layer on the substrate and the bottom electrode patterns; and etching the planarization assistant layer to expose the top surface of the bottom electrode patterns and providing a remnant planarization assistant layer between the bottom electrode patterns.

9. The method of claim 8, further comprising steps of:

depositing an oxidation barrier layer on the interlayer insulation layer and the bottom electrode patterns after the step of forming the bottom electrode patterns and before the step of forming the planarization assistant layer; and etching the oxidation barrier layer from the top surface of the bottom electrode patterns.

10. The method of claim 7, wherein the step of forming a seed layer over the bottom electrode patterns further comprises a step of etching the seed layer to expose the top surface of the bottom electrode patterns.

11. The method of claim 7, wherein the first ferroelectric material layer is formed by a sol-gel transformation.

12. The method of claim 7, wherein the first ferroelectric material layer and the second ferroelectric material layer are formed of the same material.

13. A method of fabricating a ferroelectric memory device, comprising steps of:

forming an interlayer insulation layer pierced by at least two contact plugs on a semiconductor substrate;

forming a conductive layer on the interlayer insulation layer;

patterning the conductive layer to form at least two bottom electrode patterns, each of which are electrically connected with one of the contact plugs;

forming a seed layer on the bottom electrode patterns and the interlayer insulation layer;

forming a first ferroelectric material on the seed layer;

etching the first ferroelectric material and the seed layer to expose a top surface of the bottom electrode patterns;

forming a second ferroelectric material on the exposed top surface of the bottom electrode patterns and the top surface of the first ferroelectric material to form a ferroelectric material layer for a capacitor;

thermally treating the first and second ferroelectric materials to cause a predetermined change in their ferroelectric structure; and forming a capacitor top electrode electrically connected with the second ferroelectric material.

14. The method of claim 13, further comprising the step of forming an adhesion assistant layer on the interlayer insulation layer before the step of forming the conductive layer.

15. The method of claim 13, further comprising the steps of:

forming a planarization assistant layer on the bottom electrode patterns and the interlayer insulation layer after the step of forming the bottom electrode patterns and before the step of forming the seed layer; and etching the planarization assistant layer to expose the top surface of the bottom electrode patterns.

16. The method of claim 13, wherein the thermal treatment is performed at a temperature above 550° C.

* * * * *